(12) United States Patent
Sugisawa

(10) Patent No.: US 10,585,131 B2
(45) Date of Patent: Mar. 10, 2020

(54) IN-VEHICLE DETERMINATION CIRCUIT AND IN-VEHICLE POWER SUPPLY DEVICE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Yuuki Sugisawa, Mie (JP)

(73) Assignees: AutoNetowrks Technologies, Ltd., Yokkaichi, Mie (JP); Sumitomo Wiring Systems, Ltd., Yokkaichi, Mie (JP); Sumitomo Electric Industrie, Ltd., Osaka-Shi, Osaka (JP)

( * ) Notice: Subject to any disclaimer, the term of this patent is extended or adjusted under 35 U.S.C. 154(b) by 107 days.

(21) Appl. No.: 16/004,481

(22) Filed: Jun. 11, 2018

(65) Prior Publication Data

US 2019/0086462 A1    Mar. 21, 2019

(30) Foreign Application Priority Data

Sep. 20, 2017    (JP) .................................. 2017-180036

(51) Int. Cl.

| G01R 19/00 | (2006.01) |
|---|---|
| G01R 31/00 | (2006.01) |
| H02M 1/088 | (2006.01) |
| H02M 3/156 | (2006.01) |
| H02M 1/32 | (2007.01) |
| H02M 3/158 | (2006.01) |
| G01R 19/165 | (2006.01) |
| B60R 16/03 | (2006.01) |
| H02M 1/00 | (2006.01) |

(52) U.S. Cl.
CPC ..... *G01R 31/006* (2013.01); *G01R 19/16538* (2013.01); *H02M 1/088* (2013.01); *H02M 1/32* (2013.01); *H02M 3/156* (2013.01); *H02M 3/1582* (2013.01); *B60R 16/03* (2013.01); *H02M 2001/0009* (2013.01)

(58) Field of Classification Search
CPC ...... H03F 3/087; H03F 2200/474; G01J 1/44; G01R 19/0092; G01R 31/006
See application file for complete search history.

(56) References Cited

FOREIGN PATENT DOCUMENTS

| JP | 2012-231562 A | 11/2012 |
| JP | 2012231562 | * 11/2012 ............ H02M 3/155 |

* cited by examiner

*Primary Examiner* — Alesa Allgood
(74) *Attorney, Agent, or Firm* — Honigman LLP

(57) ABSTRACT

An in-vehicle determination has a current generation circuit and a comparison circuit. The current generation circuit is provided with a second resistance unit electrically connected on one end side to a second reference conduction path that is set to a second reference potential that is higher than a first reference potential of a first reference conduction path, and allows a current that depends on the current flowing through a first resistance unit to flow to the second resistance unit from the second reference conduction path side. The comparison circuit outputs a first signal in the case where the potential of the other end of the second resistance unit is smaller than a threshold potential that is generated with reference to the second reference potential, and outputs a second signal in the case where the potential of the other end of the second resistance unit is larger than the threshold potential.

5 Claims, 3 Drawing Sheets

IN-VEHICLE DETERMINATION CIRCUIT AND IN-VEHICLE POWER SUPPLY DEVICE

CROSS-REFERENCE TO RELATED APPLICATIONS

This application claims priority of Japanese Patent Application No. JP 2017-180036 filed Sep. 20, 2017.

FIELD OF THE INVENTION

The present description relates to an in-vehicle determination circuit and an in-vehicle power supply device.

BACKGROUND OF THE INVENTION

JP 2012-231562A discloses an example of a DC/DC converter that can perform a protection operation when an overcurrent anomaly occurs. The DC/DC converter disclosed in JP 2012-231562A is provided with a shunt resistor between a switching element of a voltage conversion unit (step-up unit) and ground, and forms a configuration that compares a mid-point voltage between the switching element and the shunt resistor with a reference voltage (second threshold voltage) using a comparison unit (third comparison unit). The reference voltage (second threshold voltage) is generated by a voltage generation unit (second voltage generation unit) with reference to ground, and when the mid-point voltage between the switching element and the shunt resistor becomes higher than the reference voltage, the output signal of the comparison unit (third comparison unit) switches to high level, and the switching element turns off.

The DC/DC converter disclosed in JP 2012-231562A forms a circuit configuration that determines whether the current flowing through the shunt resistor provided on the ground side exceeds a threshold value by comparing the potential at one end of the shunt resistor with a reference potential that is generated by the voltage generation unit. However, with this circuit, there is a risk of not being able to perform the determination accurately if the ground potential varies.

For example, in the case where circuitry of the power system in which the shunt resistor is provided is connected to ground (power ground) of the electric power system, the potential (detection potential) at one end of the shunt resistor will be generated with reference to power ground. On the other hand, in the case where the voltage generation unit for generating the reference potential is connected to ground (signal ground) of the signal system, the reference potential will be generated with reference to signal ground. With this circuit, a condition for accurately determining whether the current flowing through the shunt resistor exceeds the threshold value is that the potential difference between power ground and signal ground is zero or very small, and accurate determination is difficult when one or both grounds vary. In particular, since a high current flows to and from power ground, there is concern about the tendency of the ground potential to vary depending on the ground configuration and the state of the inflow/outflow current, and the tendency for a difference to arise with the potential of signal ground. Note that the problem of the accuracy of current determination dropping due to variation in the ground potential is not limited to a configuration in which power ground and signal ground are separated, and is cause for concern if the connection position of the shunt resistor is separated from the connection position of the voltage generation unit that generates the reference potential.

The present description has been made in order to solve at least one of the abovementioned problems, and an object thereof is to more accurately determine whether a current flowing between a voltage conversion unit and a reference conduction path is in a predetermined overcurrent state.

SUMMARY OF THE INVENTION

An in-vehicle determination circuit according to one aspect of the description is an in-vehicle determination circuit for performing, with respect to an in-vehicle power supply device that includes a voltage conversion unit configured to perform an operation of stepping up or stepping down a voltage applied to a first conduction path and applying a resultant voltage to a second conduction path and a first resistance unit that is electrically connected on one end side to the voltage conversion unit and is electrically connected on another end side to a first reference conduction path that is set to a first reference potential, determination of a state of a current flowing through the first resistance unit, the in-vehicle determination circuit including a current generation circuit including a second resistance unit electrically connected on one end side to a second reference conduction path that is set to a second reference potential that is higher than the first reference potential of the first reference conduction path, and configured to allow a current that depends on the current flowing through the first resistance unit to flow to the second resistance unit from the second reference conduction path side, and a comparison circuit configured to output a first signal in a case where a potential of another end of the second resistance unit is smaller than a threshold potential that is generated with reference to the second reference potential, and to output a second signal in a case where the potential of the other end of the second resistance unit is larger than the threshold potential.

An in-vehicle power supply device according to one aspect of the description includes the above in-vehicle determination circuit, the above first resistance unit, and the above voltage conversion unit.

In the present description, a current generation circuit is provided with a second resistance unit electrically connected on one side to a second reference conduction path, and the potential of the second reference conduction path to which the second resistance unit is connected is higher than the potential (first reference potential) of a first reference conduction path. Furthermore, since the current generation circuit is configured to allow a current that depends on the current flowing through the first resistance unit to flow to the second resistance unit from the second reference conduction path side, the potential difference between both ends of the second resistance unit will be a value that depends on the current flowing through the first resistance unit. The potential of the other end of the second resistance unit is determined based on this potential difference and the potential (second reference potential) of the second reference conduction path, and when the current flowing through the first resistance unit becomes large enough to exceed a predetermined value, the potential of the other end of the second resistance unit becomes smaller than a threshold potential, and the first signal is output from the comparison circuit. Adopting this configuration enables an overcurrent state in which the current flowing between the voltage conversion unit and the first reference conduction path exceeds a predetermined value (state in which the potential of the other end of the second resistance unit becomes smaller than the threshold potential) to be detected. Moreover, with the present description, since a detection potential that reflects the current flowing through the first resistance unit (potential of the other end of the second resistance unit) and the threshold potential that serves as the object of comparison are both generated with reference to the potential (second reference potential) of the second reference conduction path, a large drop in determination accuracy tends not to occur even when there is variation in the potential of the first reference conduction path, and it can be more accurately determined whether the current flowing between the voltage conversion unit and the first reference conduction path is in an overcurrent state exceeding a predetermined value.

DETAILED DESCRIPTION OF THE PREFERRED EMBODIMENTS

Figure 1:
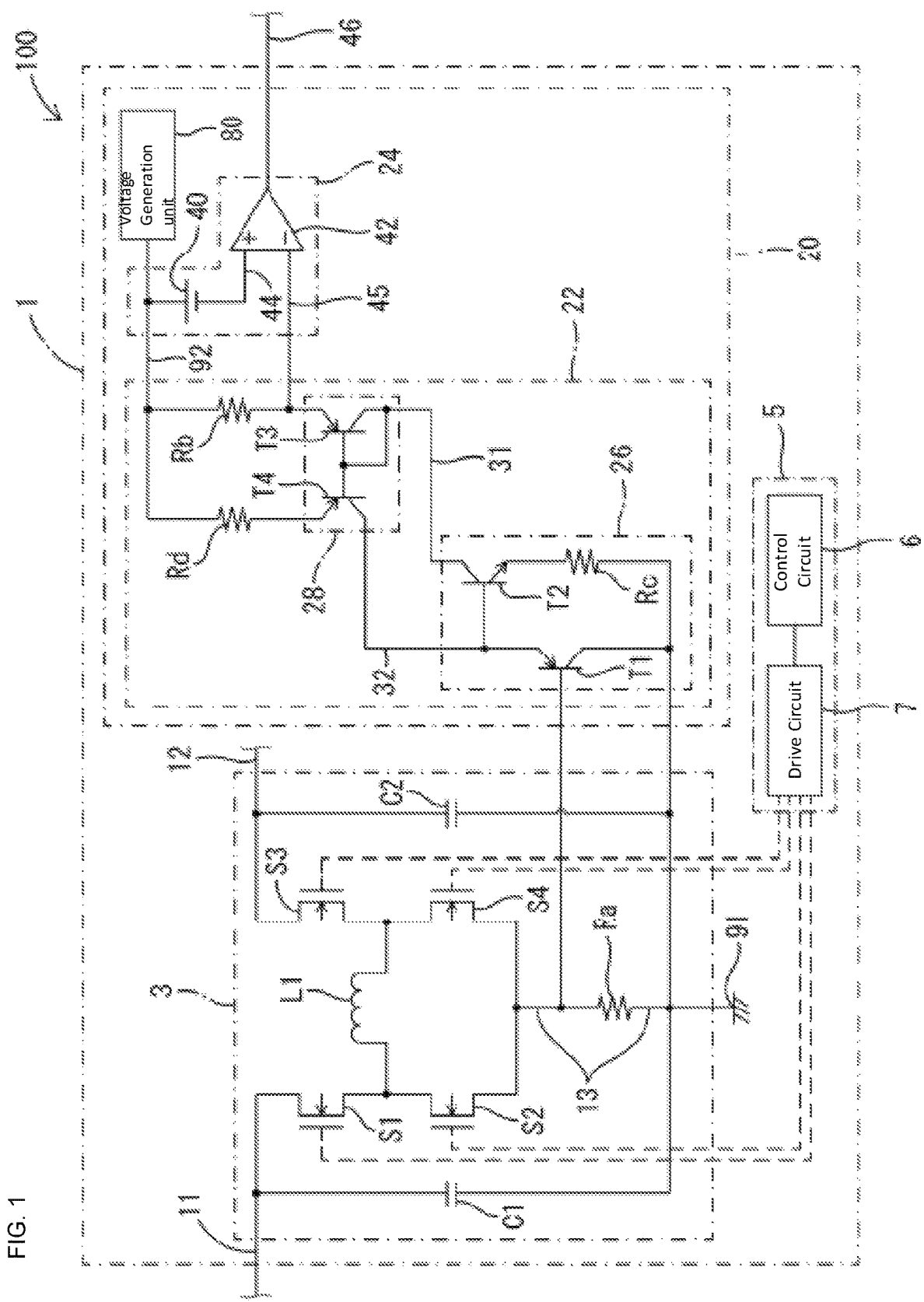
FIG. 1 is a circuit diagram schematically illustrating an in-vehicle power supply system provided with an in-vehicle power supply device of a first embodiment.

Here, a desirable example of the description will be illustrated. A current generation circuit may be provided with a third resistance unit electrically connected to a first reference conduction path. The current generation circuit may be configured to allow a current obtained by increasing or decreasing the current flowing through a first resistance unit by a degree of amplification that depends on the ratio of the resistance value of the first resistance unit and the resistance value of the third resistance unit to flow to a second resistance unit.

According to this configuration, a circuit that can allow a current obtained by increasing or decreasing the current of the first resistance unit by a desired degree of amplification to flow to the second resistance unit can be constituted.

Note that, in the case of increasing or decreasing the current flowing through the first resistance unit by a degree of amplification that depends on the ratio of the resistance value of the first resistance unit and the resistance value of the third resistance unit, robustness to fast variations in power supply increases when amplification is performed without using negative feedback.

The current generation circuit may be provided with a sensing resistance unit electrically connected on one end side to the second reference conduction path, a mirror resistance unit electrically connected on one end side to the second reference conduction path, and a current mirror circuit connected to another end side of the sensing resistance unit and another end side of the mirror resistance unit, and configured to allow a mirror current that reflects a sensing current flowing through the sensing resistance unit with a predetermined mirror ratio to flow to the mirror resistance unit and to allow currents respectively corresponding to currents of the sensing resistance unit and the mirror resistance unit to respectively flow to a sensing current path and a mirror current path. Furthermore, the current generation circuit may be provided with a voltage-current conversion circuit configured to set a potential difference between the mirror current path and one end of the third resistance unit to a potential difference adjusted to a potential difference between the mirror current path and one end of the first resistance unit, in response to a current flowing to both of the sensing current path and the mirror current path, and to allow a current that depends on the current flowing through the first resistance unit to flow to the third resistance unit. Furthermore, the current generation circuit may be configured to allow a current that depends on the current flowing through the third resistance unit to flow to the sensing resistance unit, and one of the sensing resistance unit and the mirror resistance unit may be constituted as the second resistance unit.

With this configuration, the current generation circuit can be operated to set the potential difference between both ends of the third resistance unit to a value that depends on the potential difference between both ends of the first resistance unit by allowing a sensing current and a mirror current to flow, and to allow a current that depends on the current flowing through the first resistance unit to flow to the third resistance unit and allow a current that depends on the current flowing through the third resistance unit to flow to the sense resistance unit. Since the mirror current flowing through the mirror resistance unit is a current that reflects the sensing current flowing through the sensing resistance unit with a predetermined mirror ratio, a current that depends on the current flowing through the first resistance unit will flow to the second resistance unit, if either the sensing resistance unit or the mirror resistance unit is constituted as the second resistance unit. Since such operation can be performed based on the sensing current and mirror current whose current values are readily reduced, power consumption is readily suppressed.

The second reference conduction path may be kept at the second reference potential due to a predetermined voltage being applied by the voltage generation unit.

In this way, if the second reference conduction path is kept at the second reference potential due to a predetermined voltage being applied by the voltage generation unit, a detection potential that reflects the current flowing through the first resistance unit (potential of the other end of the second resistance unit) and the threshold potential serving as the object of comparison will both be generated based on the output voltage of the voltage generation unit, and the influence of potential variation of the first reference conduction path will be more readily eliminated.

First Embodiment

Hereinafter, a first embodiment that embodies the present description will be described.

FIG. 1 illustrates an in-vehicle power supply system 100 provided with an in-vehicle power supply device 1 (hereinafter, may be simply referred to as power supply device 1) and a first power supply unit and a second power supply unit which are not shown.

The power supply device 1 is constituted as an in-vehicle step-up/down DC/DC converter, and forms a configuration in which a direct-current voltage applied to one of a first conduction path 11 and a second conduction path 12 is stepped up or stepped down and output to the other conduction path. The power supply device 1 is provided with the first conduction path 11, the second conduction path 12, a voltage conversion unit 3, a control device 5, a first resistance unit Ra, and an in-vehicle determination circuit 20 (hereinafter, also referred to as determination circuit 20) and the like.

The first conduction path 11 forms a configuration that can establish an electrical connection to a terminal on the high potential side of the first power supply unit which is not shown, for example, and forms a configuration to which a predetermined direct-current voltage is applied from the first power supply unit. The second conduction path 12 forms a configuration that can establish an electrical connection to a terminal on the high potential side of the second power supply unit which is not shown, for example, and forms a configuration to which a predetermined direct-current voltage is applied from the second power supply unit. The first power supply unit and the second power supply unit are constituted by, for example, a well-known electrical storage means such as a lead storage battery, a lithium ion battery, an electric double-layer capacitor or similar electrical storage element. Terminals on the low potential side of the first power supply unit and the second power supply unit are kept at ground potential (0 V). An in-vehicle load is electrically connected either or both of the first conduction path 11 and the second conduction path 12, and either or both of the conduction paths form a power supply path to the load. Note that a configuration may be adopted in which only one of the first power supply unit and the second power supply unit is provided.

The voltage conversion unit 3, which performs an operation of stepping up or stepping down the input voltage applied to the first conduction path 11 and applying the resultant voltage to the second conduction path 12, is provided between the first conduction path 11 and the second conduction path 12. The voltage conversion unit 3 is provided between the first conduction path 11 and the second conduction path 12, and is provided with switch elements S1, S2, S3 and S4 arranged in an H-bridge structure and an inductor L1. The switch elements S1, S2, S3 and S4 are constituted as semiconductor switch elements, and, in the example shown in FIG. 1, are each constituted as an N-channel MOSFET. One end of a capacitor C1 is electrically connected to the first conduction path 11, and the other end of the capacitor C1 is electrically connected to a first reference conduction path 91 which is ground. One end of a capacitor C2 is electrically connected to the second conduction path 12, and the other end of the capacitor C2 is electrically connected to the first reference conduction path 91 which is ground.

The first reference conduction path 91 is, for example, constituted by a ground plane formed on a substrate which is not shown or the like, and is electrically connected to a grounded part (e.g., body) within the vehicle via a connecting component which is not shown. The potential of the first reference conduction path 91 is kept at a predetermined ground potential (e.g., 0 V) in general.

In the voltage conversion unit 3, the first conduction path 11 is electrically connected to a drain of the switch element S1, and a drain of the switch element S2 and one end of the inductor L1 are electrically connected to a source of the switch element S1. The second conduction path 12 is electrically connected to a drain of the switch element S3, and a drain of the switch element S4 and the other end of the inductor L1 are electrically connected to a source of the switch element S3. A third conduction path 13 is provided between the source of each of the switch elements S2 and S4 and ground. The first resistance unit Ra is interposed on the third conduction path 13, with the source of each of the switch elements S2 and S4 and one end of the first resistance unit Ra being electrically connected to the third conduction path 13, and the other end of first resistance unit Ra being electrically connected to the first reference conduction path 91 which is ground. Signals from the control device 5 which will be discussed later are respectively input to gates of the switch elements S1, S2, S3 and S4.

Although not shown, a first voltage detection circuit constituted as a well-known voltage detection circuit that detects the voltage of the first conduction path 11 is provided in the power supply device 1, and the first voltage detection circuit inputs a value reflecting the voltage value of the first conduction path 11 to a control circuit as a detection value. Also, a first current detection circuit constituted as a well-known current detection circuit that detects the current of the first conduction path 11 is provided, and the first current detection circuit inputs a value reflecting the current value of the first conduction path 11 to the control circuit as a detection value. Furthermore, a second voltage detection circuit constituted as a well-known voltage detection circuit that detects the voltage of the second conduction path 12 is provided, and the second voltage detection circuit inputs a value reflecting the voltage value of the second conduction path 12 to the control circuit as a detection value. Also, a second current detection circuit constituted as a well-known current detection circuit that detects the current of the second conduction path 12 is provided, and the second current detection circuit inputs a value reflecting the current value of the second conduction path 12 to the control circuit as a detection value.

The control device 5 is provided with a control circuit 6 and a drive circuit 7. The control circuit 6 is constituted as an information processing device such as a microcomputer, for example, and is provided with memories such as a ROM and a RAM and a computational device such as a CPU. The control circuit 6 performs feedback control with a well-known method based on the detection values (voltage values and current values) that are input from the first voltage detection circuit, the first current detection circuit, the second voltage detection circuit and the second current detection circuit that are described above and target voltage and current values, and sets the duty ratio of a PWM signal. The PWM signal of the set duty ratio is output to the drive circuit 7.

The drive circuit 7 is a circuit that outputs control signals that turn the switch elements S1, S2, S3 and S4 on and off. This drive circuit 7 has a function of distributing and outputting the PWM signal generated by the control circuit 6.

The power supply device 1 may function as a bidirectional step-up/step-down DC/DC converter, or may function as a unidirectional DC/DC converter. Hereinafter, the case where the power supply device 1 functions as a unidirectional DC/DC converter is illustrated.

In the power supply device 1, when in a predetermined step-down mode, for example, the PWM signal is output from the control device 5 to the gate of the switch element S1, and the PWM signal is output in a complementary manner to the gate of each of the switch elements S1 and S2 in a state where dead time is set. When in this step-down mode, the control device 5 performs a feedback computation (calculation of duty that approximates the voltage value of the second conduction path 12 to a target voltage value) every predetermined period with a well-known method, based on the voltage value of the second conduction path 12 and the target voltage value, and determines the duty of the PWM signal that is provided to the gate of the switch element S1. In this mode, a step-down operation is performed such that an OFF signal is output to the gate of the switch element S2 in the period during which an ON signal is output to the gate of the switch element S1, and an ON signal is output to the gate of the switch element S2 in the period during which an OFF signal is output to the gate of the switch element S1, except for dead time. The output voltage that is applied to the second conduction path 12 is determined according to the duty of the PWM signal that is provided to the gate of the switch element S1. In this step-down mode, since an ON signal is continuously input to the gate of the switch element S3 and an OFF signal is continuously input to the gate of the switch element S4, the switch element S3 is maintained in the ON state and the switch element S4 is maintained in the OFF state.

Also, in a predetermined step-up mode, the PWM signal is output from the control device 5 to the gate of the switch element S4, and the PWM signal is output in a complementarily manner to the gate of each of the switch elements S3 and S4 in a state where dead time is set. When in this step-down mode, the control device 5 performs a feedback computation (calculation of duty that approximates the voltage value of the second conduction path 12 to a target voltage value) every predetermined period with a well-known method, based on the voltage value of the second conduction path 12 and the target voltage value, and determines the duty of the PWM signal that is provided to the gate of the switch element S4. In this mode, a step-up operation is performed such that an OFF signal is output to the gate of the switch element S3 in the period during which an ON signal is output to the gate of the switch element S4, and an ON signal is output to the gate of the switch element S3 in the period during which an OFF signal is output to the gate of the switch element S4, except for dead time. The output voltage that is applied to the second conduction path 12 is determined according to the duty of the PWM signal that is provided to the gate of the switch element S4. In this step-up mode, since an ON signal is continuously input to the gate of the switch element S1 and an OFF signal is continuously input to the gate of the switch element S2, the switch element S1 is maintained in the ON state and the switch element S2 is maintained in the OFF state.

Next, a configuration for detecting overcurrent between the voltage conversion unit and ground will be described. The determination circuit 20 shown in FIG. 1 has a function of determining the state of a current flowing through the first resistance unit Ra, with the power supply device 1 as the object of determination.

The first resistance unit Ra is electrically connected on one end side to the voltage conversion unit 3 and is electrically connected on the other end side to the first reference conduction path 91 which is set to a first reference potential V1. The potential (first reference potential V1) of the first reference conduction path 91 is 0 V in general. With the configuration of FIG. 1, the potential of the other end of the first resistance unit Ra will be the first reference potential V1, and is kept at 0 V in general.

The determination circuit 20 is mainly provided with a current generation circuit 22 and a comparison circuit 24. The current generation circuit 22 is provided with a voltage-current conversion circuit 26, a current mirror circuit 28, a second resistance unit Rb, and a fourth resistance unit Rd. The comparison circuit 24 is provided with a reference potential generation unit 40 and a comparator 42.

The current generation circuit 22 is configured such that one end side of the second resistance unit Rb is electrically connected to a second reference conduction path 92, and to allow a current that depends on the current flowing through the first resistance unit Ra to flow to the second resistance unit Rb from the second reference conduction path 92 side.

The second reference conduction path 92 is a conduction path to which a predetermined power supply voltage is applied by a voltage generation unit 80. The potential of the second reference conduction path 92 is set to a second reference potential V2 that is higher than the first reference potential V1 of the first reference conduction path 91. The voltage generation unit 80 is, for example, constituted as a well-known voltage regulator such as a linear regulator or a switching regulator, and applies a predetermined power supply voltage to the second reference conduction path 92, and keeps the potential of the second reference conduction path 92 at a predetermined potential (second reference potential V2) that is higher than the first reference potential V1. A relationship in which the first reference potential V1 is set to 0 V and the second reference potential V2 is set to 5 V is given as one example, but the present description is not intended to be limited to this relationship.

In the current generation circuit 22, the second resistance unit Rb is a component that function as an example of a sensing resistance unit, and is constituted as a well-known resistor, for example, with one end side being electrically connected to the second reference conduction path 92, and the other end side being electrically connected to one current input side (transistor T3 side) of the current mirror circuit 28. The fourth resistance unit Rd is a component that functions as an example of a mirror resistance unit, and is constituted as a well-known resistor, for example, with the one end side being electrically connected to the second reference conduction path 92, and the other end side being electrically connected to the other current input side (transistor T4 side) of the current mirror circuit 28.

The current mirror circuit 28 is connected to the other end of the second resistance unit Rb (sensing resistance unit) and the other end side of the fourth resistance unit Rd (mirror resistance unit), and is configured to allow a mirror current that reflects the sensing current flowing through the second resistance unit Rb (sensing resistance unit) with a predetermined mirror ratio (e.g., mirror ratio "1") to flow to the fourth resistance unit Rd (mirror resistance unit), and to allow currents respectively corresponding to the currents of the second resistance unit Rb (sensing resistance unit) and the fourth resistance unit Rd (mirror resistance unit) to respectively flow to a sensing current path 31 and a mirror current path 32.

The current mirror circuit 28 is provided with transistors T3 and T4 having the same configuration, and these transistors T3 and T4 are both constituted as PNP bipolar transistors. An emitter of the transistor T3 is electrically connected to the other end of the second resistance unit Rb (end on the opposite side to the second reference conduction path 92 side), and a collector of the transistor T3 is electrically connected to the sensing current path 31. A base of the transistor T3 is electrically connected to a base of the transistor T4, the collector of the transistor T3 and the sensing current path 31. An emitter of the transistor T4 is electrically connected to the other end of the fourth resistance unit Rd (end on the opposite side to the second reference conduction path 92 side), and a collector of the transistor T4 is electrically connected to the mirror current path 32. The base of the transistor T4 is electrically connected to the base of the transistor T3, the collector of the transistor T3 and the sensing current path 31.

In the current mirror circuit 28, in the case where the current value of the current (collector current of the transistor T3) flowing through the sensing current path 31 is given as Iin, and the current value of the current (collector current of the transistor T4) flowing through the mirror current path 32 is given as Iout, it can be regarded that Iin=Iout, since the base current of the transistor T3 and the base current of the transistor T4 are small enough to disregard in comparison with the respective collector currents and emitter currents. Also, a current value Is of the current (sensing current) flowing through the second resistance unit Rb can be regarded as Is=Iin.

The voltage-current conversion circuit 26 forming part of the current generation circuit 22 is constituted as a circuit that converts the voltage between both ends (potential difference between both ends) of the first resistance unit Ra into a current that depends on this voltage between both ends and allows the resultant current to flow to the third resistance unit Rc. The voltage-current conversion circuit 26 is provided with a third resistance unit Rc electrically connected to the first reference conduction path 91, a transistor T1 constituted as a PNP bipolar transistor, and a transistor T2 constituted as a NPN bipolar transistor. The transistor T1 and the transistor T2 are complimentary. The transistor T1 has a base electrically connected to one end of the first resistance unit Ra, an emitter electrically connected to the mirror current path 32 and a base of the transistor T2, and a collector electrically connected to the first reference conduction path 91. The transistor T2 has a collector electrically connected to the sensing current path 31, and an emitter electrically connected to one end of the third resistance unit Rc. Also, the other end of the third resistance unit Rc is electrically connected to the first reference conduction path 91.

In the voltage-current conversion circuit 26 configured in this way, the potential difference between the mirror current path 32 and one end of the third resistance unit Rc is set to a potential difference adjusted to the potential difference between the mirror current path 32 and one end of the first resistance unit Ra, in response to a current flowing to both the sensing current path 31 and the mirror current path 32. Specifically, a voltage Vbe between the base and emitter of the transistor T1 and a voltage Vbe between the base and emitter of the transistor T2 will be the same, and the potential difference between both ends of the first resistance unit Ra (shunt resistor) and the potential difference between both ends of the third resistance unit Rc will be the same. A current that depends on the current flowing through the first resistance unit Ra (specifically, current proportional to the current flowing through the first resistance unit Ra) thus flows to the third resistance unit Rc. In the case where the resistance value of the first resistance unit Ra is given as R1, the resistance value of the third resistance unit Rc is given as R3, the current value of the current flowing through the first resistance unit Ra is given as I1, and the current value of the current flowing through the third resistance unit Rc is given as I3, the current value I3 will be I3=I1×(R1/R3), and a current obtained by amplifying the current flowing through the first resistance unit Ra by a degree of amplification that depends on the ratio of the resistance value R1 of the first resistance unit Ra and the resistance value R3 of the third resistance unit Rc will flow to the third resistance unit Rc, and since the degree of amplification (amplification rate) decreases as the resistance value R3 increases relative to the resistance value R1, the current flowing through the third resistance unit Rc is suppressed.

With this configuration, the current flowing through the sensing current path 31 will be the collector current of the transistor T2, and the emitter current of the transistor T2 flows through the third resistance unit Rc. With this configuration, since the base current of the transistor T2 is small enough to disregard in comparison with the collector current and the emitter current, a current value I3 of the current flowing through the third resistance unit Rc can be regarded as substantially the same as a current value Iin of the current flowing through the sensing current path 31 and a current value Is of the current flowing through the second resistance unit Rb, and it can be regarded that I3=Iin=Is. In this way, the current generation circuit 22 is configured so that a current that depends on the current flowing through the third resistance unit Rc (specifically, current of substantially the same magnitude as the current flowing through the third resistance unit Rc) flows to the second resistance unit Rb (sensing resistance unit). Also, since I3=I1×(R1/R3), it can be regarded that Is=I1×(R1/R3), and the current generation circuit 22 is configured to allow a current (current of current value Is) obtained by increasing or decreasing the current (current of current value I1) flowing through the first resistance unit Ra by a degree of amplification that depends on the ratio of the resistance value R1 of the first resistance unit Ra and the resistance value R3 of the third resistance unit Rc to flow to the second resistance unit Rb.

In the case where the resistance value of the second resistance unit Rb is given as R2, a potential difference Vs that occurs in the second resistance unit Rb will be Vs=Is×R2, and since it can be regarded that Is=I3=I1×(R1/R3), the potential difference Vs will be Vs=I1×(R1/R3)×R2. In the case where the potential (second reference potential) of the second reference conduction path 92 is given as V2, a potential Vn of the other end of the second resistance unit Rb (potential of a negative input path 45) can be regarded as Vn=V2−Vs=V2−I1×(R1/R3)×R2, and will be a value that depends on the current value I1 of the first resistance unit Ra (value that takes the current value I1 as a parameter).

The comparison circuit 24 is a circuit that outputs a first signal in the case where the potential Vn of the other end of the second resistance unit Rb is smaller than a threshold potential Vp that is generated with reference to the second reference potential V2, and outputs a second signal in the case where the potential Vn is larger than the threshold potential Vp. The comparison circuit 24 is mainly provided with the reference potential generation unit 40 and the comparator 42.

The reference potential generation unit 40 is a circuit that is electrically connected at one end to the second reference conduction path 92, and maintains the potential difference between the potential (second reference potential V2) of the second reference conduction path 92 and the potential (threshold potential Vp) of a positive input path 44 of the comparator 42 to be a certain value Vd. The reference potential generation unit 40 is constituted by a well-known regulator such as a linear regulator or a switching regulator or similar voltage generation circuit, and, for example, applies a direct-current voltage to the positive input path 44 so that the potential of the positive input path 44 will be the threshold potential Vp of a value (Vp=V2−Vd) obtained by subtracting the certain value Vd from the second reference potential V2, with reference to the potential (second reference potential V2) of the second reference conduction path 92.

The comparator 42 is constituted as a well-known comparator, and outputs an L level signal as the second signal to an output path 46, in the case where the potential Vn of the negative input path 45 (potential on the other end side of the second resistance unit Rb) is larger than the potential Vp (threshold potential) of the positive input path 44, that is, in the case where V2−I1×(R1/R3)×R2>V2−Vd and Vd>I1×(R1/R3)×R2. Also, the comparator 42 outputs a H level signal as the first signal to the output path 46, in the case where the potential Vn of the negative input path 45 is smaller than the potential Vp of the positive input path 44, that is, in the case where Vd<I1×(R1/R3)×R2. The H level signal (first signal) that is output from the comparator 42 to the output path 46 is an overcurrent anomaly detection signal indicating that the current flowing through the first resistance unit Ra is in an overcurrent state, and the L level signal (second signal) that is output from the comparator 42 to the output path 46 is a normal state detection signal indicating that the current flowing through the first resistance unit Ra is not in an overcurrent state.

With the power supply device 1 constituted as described above, the L level signal (second signal) will be output from the comparator 42, in the case where the current flowing to the first reference conduction path 91 via the first resistance unit Ra is less than a certain value (i.e., in the case where $Vd > I1 \times (R1/R3) \times R2$), when the voltage conversion unit 3 is performing the voltage conversion operation as a result of the control device 5 outputting the PWM signal. The control device 5 may operate to continue the drive (voltage conversion operation) of the voltage conversion unit 3, on condition that the L level signal is being output from the comparator 42.

On the other hand, the H level signal (first signal) will be output from the comparator 42, in the case where a current that is greater than the certain value flows to the first reference conduction path 91 via the first resistance unit Ra (in the case where $Vd < I1 \times (R1/R3) \times R2$), when the voltage conversion unit 3 is performing the voltage conversion operation as a result of the control device 5 outputting the PWM signal. In the case where the H level signal is being output from the comparator 42 in this way, a predetermined protection operation can be performed. For example, the control device 5, in the case where the H level signal is being output from the comparator 42, may stop output of the PWM signal, and stop the drive (voltage conversion operation) of the voltage conversion unit 3. Alternatively, a protection circuit other than the control device 5 may be provided, and this protection circuit may, for example, be configured to enable the signal that is transmitted from the control device 5 to the respective gates of the switch elements S1, S2, S3 and S4 on condition that the L level signal is being output from the comparator 42, and to disable the signal that is transmitted from the control device 5 to the respective gates of the switch elements S1, S2, S3 and S4 and turn OFF all of the switch elements S1, S2, S3 and S4, in the case where the H level signal is being output from the comparator 42.

Hereinafter, the effects of this configuration will be illustrated. In this configuration, the current generation circuit 22 is provided with the second resistance unit Rb electrically connected on one side to the second reference conduction path 92, and the potential of the second reference conduction path 92 to which the second resistance unit Rb is connected is higher than the potential (first reference potential) of the first reference conduction path 91. Furthermore, since the current generation circuit 22 is configured to allow a current that depends on the current flowing through the first resistance unit Ra to flow to the second resistance unit Rb from the second reference conduction path 92 side, the potential difference between both ends of the second resistance unit Rb will be a value that depends on the current flowing through the first resistance unit Ra. Also, the potential Vn of the other end of the second resistance unit Rb is determined based on this potential difference and the potential (second reference potential V2) of the second reference conduction path 92, and when the current flowing through the first resistance unit Ra increases enough to exceed a predetermined value, the potential Vn of the other end of the second resistance unit Rb becomes smaller than the threshold potential Vp, and the first signal (H level signal) will be output from the comparator 42 of the comparison circuit 24. Adopting this configuration enables an overcurrent state in which the current flowing between the voltage conversion unit 3 and the first reference conduction path 91 exceeds a predetermined value (state in which the potential Vn of the other end of the second resistance unit Rb becomes smaller than the threshold potential Vp) to be detected.

Moreover, with this configuration, since a detection potential that reflects the current flowing through the first resistance unit Ra (potential Vn of the other end of the second resistance unit Rb) and the threshold potential Vp that serves as the object of comparison are both generated with reference to the potential (second reference potential V2) of the second reference conduction path 92, a large drop in determination accuracy tends not to occur even when there is variation in the potential of the first reference conduction path 91, and it can be more accurately determined whether the current flowing between the voltage conversion unit 3 and the first reference conduction path 91 is an overcurrent state exceeding a predetermined value.

The current generation circuit 22 is provided with the third resistance unit Rc electrically connected to the first reference conduction path 91, and is configured to allow a current obtained by increasing or decreasing the current flowing through the first resistance unit Ra by a degree of amplification that depends on the ratio of the resistance value R1 of the first resistance unit Ra and the resistance value R3 of the third resistance unit Rc to flow to the second resistance unit Rb. According to this configuration, a circuit that can allow a current obtained by increasing or decreasing the current of the first resistance unit Ra by a desired degree of amplification to flow to the second resistance unit Rb can be configured.

Moreover, with the configuration of FIG. 1, robustness to fast variations in power supply increases, since amplification is performed without using negative feedback, in increasing or decreasing the current flowing through the first resistance unit Ra by a degree of amplification that depends on the ratio of the resistance value R1 of the first resistance unit Ra and the resistance value R3 of the third resistance unit Rc.

The current generation circuit 22 is provided with a sensing resistance unit (second resistance unit Rb) electrically connected on one side to the second reference conduction path 92, a mirror resistance unit (fourth resistance unit Rd) electrically connected on one side to the second reference conduction path 92, the current mirror circuit 28 and the voltage-current conversion circuit 26. The current mirror circuit 28 is connected to the other end of the sensing resistance unit and the other end side of the mirror resistance unit, and is configured to allow a mirror current that reflects the sensing current flowing through a sensing resistance unit with a predetermined mirror ratio to flow to the mirror resistance unit, and to allow currents respectively corresponding to the currents of the sensing resistance unit and the mirror resistance unit to respectively flow to the sensing current path 31 and the mirror current path 32. The voltage-current conversion circuit 26 forms a configuration that sets the potential difference between the mirror current path 32 and one end of the third resistance unit Rc to a potential difference adjusted to the potential difference between the mirror current path 32 and one end of the first resistance unit Ra, and allows a current that depends on the current flowing through the first resistance unit Ra to flow to the third resistance unit Rc. Furthermore, the current generation circuit 22 is configured to allow a current that depends on the current flowing through the third resistance unit Rc to flow to a sensing resistance unit, and at least one of the sensing resistance unit and the mirror resistance unit (sensing resistance unit in the example of FIG. 1) is constituted as the second resistance unit Rb.

With this configuration, the current generation circuit 22 can be operated to set the potential difference between both ends of the third resistance unit Rc to a value that depends on the potential difference between both ends of the first resistance unit Ra by allowing the sensing current and the mirror current to flow, and to allow a current that depends on the current flowing through the first resistance unit Ra to flow to the third resistance unit Rc and allow a current that depends on the current flowing through the third resistance unit Rc to flow to the sensing resistance unit (second resistance unit Rb). Since the mirror current flowing through the mirror resistance unit (fourth resistance unit Rd) is a current that reflects the sensing current flowing through the sensing resistance unit with a predetermined mirror ratio, a current that depends on the current flowing through the first resistance unit Ra will flow to the second resistance unit Rb if either the sensing resistance unit or the mirror resistance unit is constituted as the second resistance unit Rb. Since such operations can be performed based on the sensing current and the mirror current whose current values can be readily reduced, power consumption is readily suppressed. Also, with this configuration, it is possible to perform detection over a broader range, by using the current mirror circuit 28.

The second reference conduction path 92 is kept at the second reference potential due to a predetermined voltage being applied by the voltage generation unit 80. In this way, if the second reference conduction path 92 is kept at the second reference potential due to a predetermined voltage being applied by the voltage generation unit 80, a detection potential that reflects the current flowing through the first resistance unit Ra (potential Vn of the other end of the second resistance unit Rb) and the threshold potential Vp that serves as the object of comparison will both be generated based on the output voltage of the voltage generation unit 80, and the influence of potential variation of the first reference conduction path 91 will be more readily eliminated.

Second Embodiment

Figure 2:
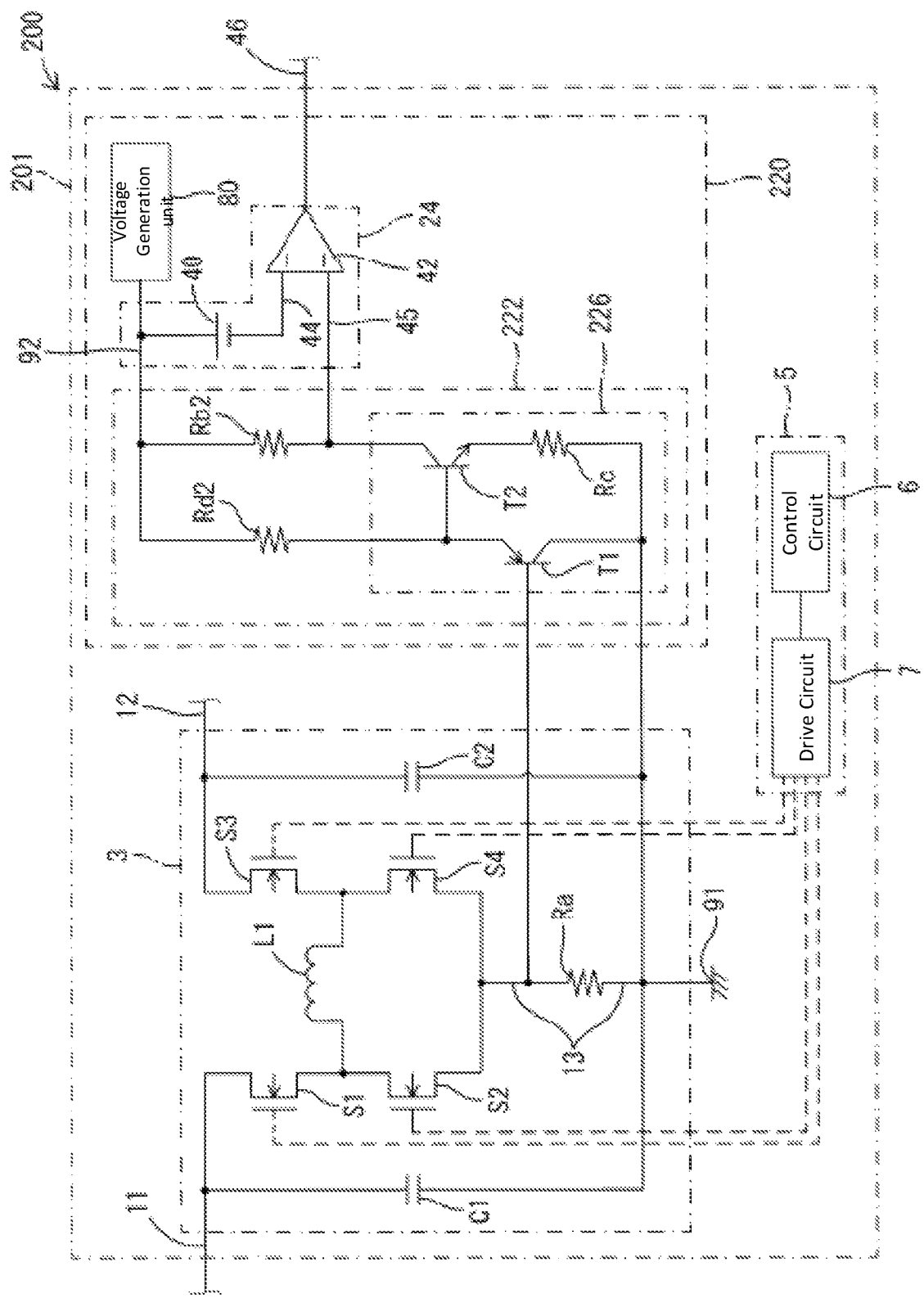
FIG. 2 is a circuit diagram schematically illustrating an in-vehicle power supply system provided with an in-vehicle power supply device of a second embodiment.

Next, a second embodiment will be described with reference to FIG. 2. An in-vehicle power supply device 201 (hereinafter, also referred to as power supply device 201) shown in FIG. 2 differs from the in-vehicle power supply device 1 of the first embodiment in that an in-vehicle determination circuit 220 (hereinafter, also referred to as determination circuit 220) is used instead of the in-vehicle determination circuit 20. The determination circuit 220 differs from the determination circuit 20 of the first embodiment only in terms of being provided with a current generation circuit 222 instead of the current generation circuit 22. Note that the in-vehicle power supply system 200 shown in FIG. 2 is the same as the in-vehicle power supply system 100 shown in FIG. 1, except for the current generation circuit 222 being provided instead of the current generation circuit 22. In the power supply device 201 shown in FIG. 2, portions forming configurations that are similar to the power supply device 1 shown in FIG. 1 are given the same reference signs as the power supply device 1, and a detailed description thereof is omitted.

In the determination circuit 220 shown in FIG. 2, a voltage-current conversion circuit 226 forms a similar configuration to the voltage-current conversion circuit 26 of FIG. 1, except for the connection on the upper side. The voltage-current conversion circuit 226 is constituted as a circuit that converts the voltage between both ends (potential difference between both ends) of a first resistance unit Ra into a current that depends on this voltage between both ends, and allows the resultant current to flow to a third resistance unit Rc. The voltage-current conversion circuit 226 is provided with the third resistance unit Rc electrically connected to the first reference conduction path 91, a transistor T1 constituted as a PNP bipolar transistor, and a transistor T2 constituted as a NPN bipolar transistor. The transistor T1 and the transistor T2 are complimentary. The transistor T1 has a base electrically connected to one end of the first resistance unit Ra, an emitter electrically connected to the other end of a fourth resistance unit Rd2 and a base of the transistor T2, and a collector electrically connected to the first reference conduction path 91. The transistor T2 has a collector electrically connected to the other end of a second resistance unit Rb2, and an emitter electrically connected to one end of the third resistance unit Rc. The other end of the third resistance unit Rc is electrically connected to the first reference conduction path 91. One end of second resistance unit Rb2 is electrically connected to a second reference conduction path 92, and one end of fourth resistance unit Rd2 is also electrically connected to the second reference conduction path 92. The second reference conduction path 92 has a similar configuration to the first embodiment, and the potential is kept at the second reference potential V2.

With this configuration, the potential difference between the other end of the fourth resistance unit Rd2 and one end of the third resistance unit Rc is set to a potential difference adjusted to the potential difference between the other end of the fourth resistance unit Rd2 and one end of the first resistance unit Ra, in response to a current flowing to both the second resistance unit Rb2 and the fourth resistance unit Rd2. Specifically, a voltage Vbe between the base and emitter of the transistor T1 and a voltage Vbe between the base and emitter of the transistor T2 will be the same, and the potential difference between both ends of the first resistance unit Ra (shunt resistor) and the potential difference between both ends of the third resistance unit Rc will be the same. A current that depends on the current flowing through the first resistance unit Ra (specifically, current proportional to the current flowing through the first resistance unit Ra) thus flows to the third resistance unit Rc. In the case where the resistance value of the first resistance unit Ra is given as R1, the resistance value of the third resistance unit Rc is given as R3, the current value of the current flowing through the first resistance unit Ra is given as I1, and the current value of the current flowing through the third resistance unit Rc is given as I3, the current value I3 will be I3=I1×(R1/R3), and a current obtained by amplifying the current flowing through the first resistance unit Ra by a degree of amplification that depends on the ratio of a resistance value R1 of the first resistance unit Ra and a resistance value R3 of the third resistance unit Rc will flow to the third resistance unit Rc, and since the degree of amplification (amplification rate) decreases as the resistance value R3 increases relative to the resistance value R1, the current flowing through the third resistance unit Rc is suppressed.

With the configuration of FIG. 2, the current flowing through the second resistance unit Rb2 will be the collector current of the transistor T2, and the emitter current of the transistor T2 flows through the third resistance unit Rc. With this configuration, since the base current of the transistor T2 is small enough to disregard in comparison with the collector current and the emitter current, the current value I3 of the current flowing through the third resistance unit Rc can be regarded as substantially the same as the current value Is of the current flowing through the second resistance unit Rb2, and can be regarded that I3=Is. In this way, the current generation circuit 222 is configured to allow a current that depends on the current flowing through the third resistance unit Rc (specifically, current of substantially the same magnitude as the current flowing through the third resistance unit Rc) to flow to the second resistance unit Rb2. Also, since I3=I1×(R1/R3), it can be regarded that Is=I1×(R1/R3), and the current generation circuit 222 is configured to allow a current (current of current value Is) obtained by increasing or decreasing the current (current of current value I1) flowing through the first resistance unit Ra by a degree of amplification that depends on the ratio of the resistance value R1 of the first resistance unit Ra and the resistance value R3 of the third resistance unit Rc to flow to the second resistance unit Rb.

Even with this configuration, in the case where the resistance value of the second resistance unit Rb2 is given as R2, a potential difference Vs that occurs in the second resistance unit Rb2 will be Vs=Is×R2, and since it can be regarded that Is=I3=I1×(R1/R3), the potential difference Vs will be Vs=I1×(R1/R3)×R2. In the case where the potential (second reference potential) of the second reference conduction path 92 is given as V2, a potential Vn of the other end of the second resistance unit Rb2 (potential of a negative input path 45) can be regarded as Vn=V2−Vs=V2−I1×(R1/R3)×R2, and will be a value that depends on the current value I1 of the first resistance unit Ra (value that takes the current value I1 as a parameter).

A comparator 42 outputs a L level signal as a second signal to an output path 46, in the case where the potential Vn of the negative input path 45 (potential on the other end side of the second resistance unit Rb2) is larger than a potential Vp (threshold potential) of a positive input path 44, that is, in the case where V2−I1×(R1/R3)×R2>V2−Vd and Vd>I1×(R1/R3)×R2. Also, the comparator 42 outputs a H level signal as a first signal to the output path 46, in the case where the potential Vn of the negative input path 45 is smaller than the potential Vp of the positive input path 44, that is, in the case where Vd<I1×(R1/R3)×R2. Note that operations in the case where the first signal is output from the comparator 42 and operations in the case where the second signal is output can be configured similarly to the first embodiment.

Other Embodiments

The present description is not limited to the embodiments illustrated by the above description and drawings, and embodiments such as the following are also included in the technical scope of the description, for example. Also, the abovementioned embodiments and the following embodiments can be combined to the extent that there are no mutual inconsistencies.

Figure 3:
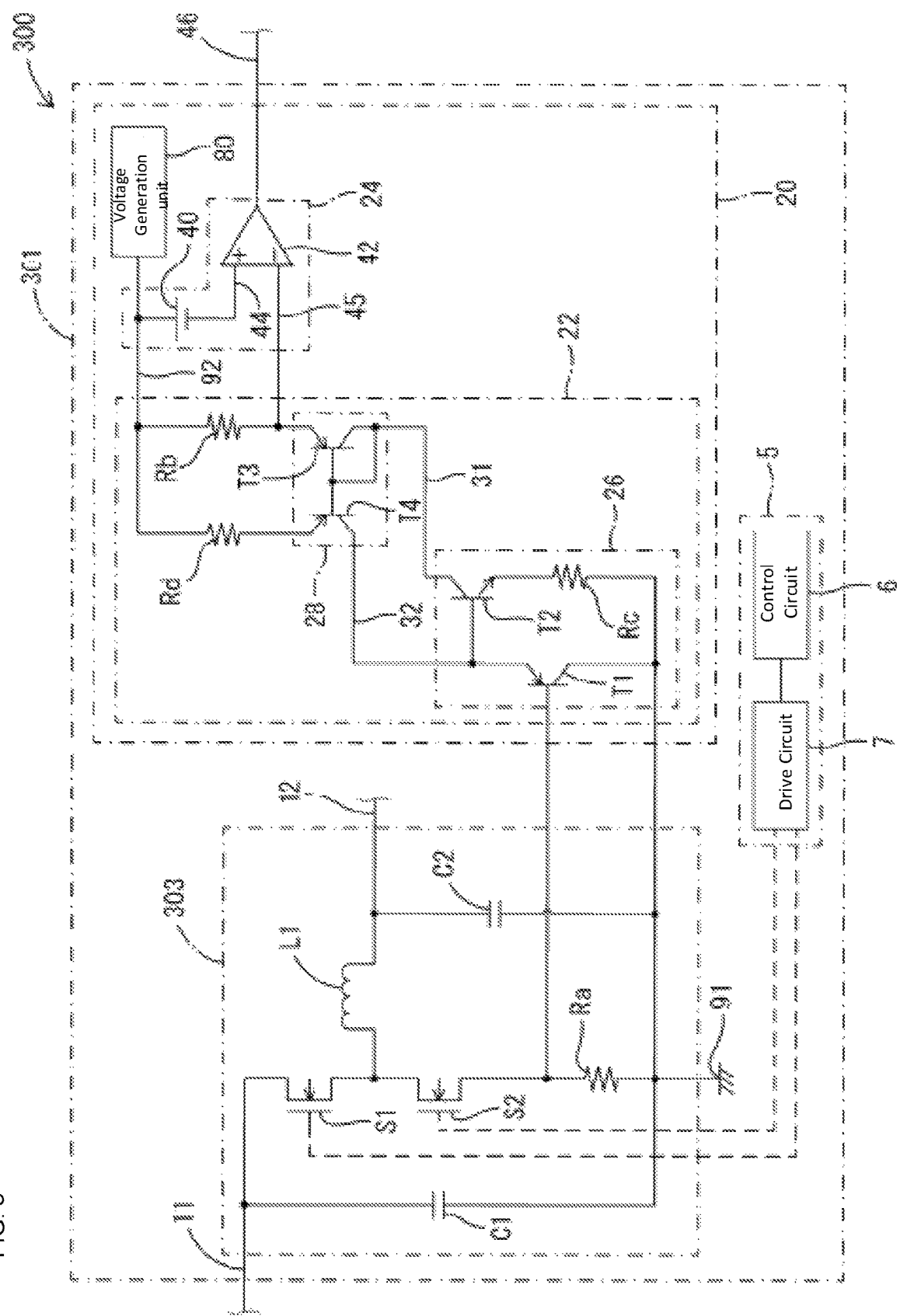
FIG. 3 is a circuit diagram schematically illustrating an in-vehicle power supply system provided with an in-vehicle power supply device of another embodiment.

Although, in the abovementioned embodiments, a power supply device that is constituted as a step-up/down DC/DC converter was illustrated, the present description may be applied to a step-up DC/DC converter or may be applied to a step-down DC/DC converter. Also, the present description may be applied to a unidirectional DC/DC converter that converts the voltage input from one side and outputs the resultant voltage from the other side, or may be applied to a bidirectional DC/DC converter. In all of these cases, the first resistance unit can be provided between the voltage conversion unit and the first reference conduction path 91 (ground), and the determination circuit 20 or the determination circuit 220 can be connected to this first resistance unit with a similar configuration to the first and second embodiments. For example, the present description may be applied to an in-vehicle power supply device 301 such as shown in FIG. 3. Note that an in-vehicle power supply system 300 shown in FIG. 3 is the same as the in-vehicle power supply system 100 shown in FIG. 1, except for a voltage conversion unit 303 being provided instead of the voltage conversion unit 3. In the power supply device 301 shown in FIG. 3, portions forming configurations similar to the power supply device 1 shown in FIG. 1 are given the same reference signs as the power supply device 1, and a detailed description thereof is omitted. For example, a determination circuit 20 shown in FIG. 3 forms the same configuration as the determination circuit 20 of the first embodiment, and operates similarly. In this example, the voltage conversion unit 303 is, for example, constituted as a step-down converter that steps down the voltage input to a first conduction path 11 and applies the resultant voltage to a second conduction path 12, and can perform the step-down operation by outputting a PWM signal in a complementary manner from a control device 5 to switch elements S1 and S2. A first resistance unit Ra is provided between the switch element S2 on the low side and a first reference conduction path 91, and the voltage conversion unit 303 is configured such that the potential of the other end of this first resistance unit Ra will be the base potential of a transistor T1.

Although, in the abovementioned embodiments, a single-phase DC/DC converter was illustrated, the present description may be applied to a multi-phase DC/DC converter.

Although, in the abovementioned embodiments, a generator, a load or the like that is electrically connected to the first conduction path 11 or the second conduction path 12 was not illustrated, various devices and electronic components can be electrically connected to the first conduction path 11 or the second conduction path 12.

Although, in the abovementioned embodiments, an example in which the first resistance unit Ra is constituted as a resistor was shown, the first resistance unit need only be a part having a resistive component. For example, the first resistance unit Ra may be replaced by a switch element such as a FET, and it may be determined whether the current flowing through this switch element is in an overcurrent state when the switch element is ON.

Although, in the abovementioned first embodiment, a current mirror circuit 28 that is constituted by a bipolar transistor was illustrated, a current mirror circuit that is constituted by a FET may be used. Also, the current mirror circuit may be replaced by various well-known current mirror circuits (e.g., well-known circuits that highly functionalize the current mirror circuit 28).

Although, in the abovementioned first embodiment, a sensing resistance unit was used as the second resistance unit, a mirror resistance unit may be used as the second resistance unit. For example, the negative input path 45 in FIG. 1 may be electrically connected to the other end of a mirror resistance unit (fourth resistance unit Rd) rather than the other end of a sensing resistance unit (second resistance unit Rb), and the mirror resistance unit (fourth resistance unit Rd) may be caused to function as the second resistance unit.

LIST OF REFERENCE NUMERALS 1, 201, 301 In-vehicle power supply device
3, 303 Voltage conversion unit 11 First conduction path
12 Second conduction path 12
20, 220 In-vehicle determination circuit
22, 222 Current generation circuit
24 Comparison circuit
26, 226 Voltage-current conversion circuit
28 Current mirror circuit
31 Sensing current path
32 Mirror current path
80 Voltage generation unit
91 First reference conduction path
92 Second reference conduction path
Ra First resistance unit
Rb Second resistance unit (sensing resistance unit)
Rb2 Second resistance unit
Rc Third resistance unit
Rd Fourth resistance unit (mirror resistance unit)

What is claimed is:

1. An in-vehicle determination circuit for performing, with respect to an in-vehicle power supply device that includes a voltage conversion unit configured to perform an operation of stepping up or stepping down a voltage applied to a first conduction path and applying a resultant voltage to a second conduction path and a first resistance unit that is electrically connected on one end side to the voltage conversion unit and is electrically connected on another end side to a first reference conduction path that is set to a first reference potential, determination of a state of a current flowing through the first resistance unit, the in-vehicle determination circuit comprising:

a current generation circuit including a second resistance unit electrically connected on one end side to a second reference conduction path that is set to a second reference potential that is higher than the first reference potential of the first reference conduction path, and configured to allow a current that depends on the current flowing through the first resistance unit to flow to the second resistance unit from the second reference conduction path side; and a comparison circuit configured to output a first signal in a case where a potential of another end of the second resistance unit is smaller than a threshold potential that is generated with reference to the second reference potential, and to output a second signal in a case where the potential of the other end of the second resistance unit is larger than the threshold potential.

2. The in-vehicle determination circuit according to claim 1, wherein the second reference conduction path is kept at the second reference potential due to a predetermined voltage being applied by the voltage generation unit.

3. An in-vehicle power supply device comprising:
the in-vehicle determination circuit according to claim 1;
the first resistance unit; and
the voltage conversion unit.

4. The in-vehicle determination circuit according to claim 1, wherein the current generation circuit includes a third resistance unit electrically connected to the first reference conduction path, and allows a current obtained by increasing or decreasing the current flowing through the first resistance unit by a degree of amplification that depends on a ratio of a resistance value of the first resistance unit and a resistance value of the third resistance unit to flow to the second resistance unit.

5. The in-vehicle determination circuit according to claim 4, wherein the current generation circuit includes:

a sensing resistance unit electrically connected on one end side to the second reference conduction path;

a mirror resistance unit electrically connected on one end side to the second reference conduction path;

a current mirror circuit connected to another end side of the sensing resistance unit and another end side of the mirror resistance unit, and configured to allow a mirror current that reflects a sensing current flowing through the sensing resistance unit with a predetermined mirror ratio to flow to the mirror resistance unit, and to allow currents respectively corresponding to currents of the sensing resistance unit and the mirror resistance unit to respectively flow to a sensing current path and a mirror current path; and a voltage-current conversion circuit configured to set a potential difference between the mirror current path and one end of the third resistance unit to a potential difference adjusted to a potential difference between the mirror current path and one end of the first resistance unit, in response to a current flowing to both of the sensing current path and the mirror current path, and to allow a current that depends on the current flowing through the first resistance unit to flow to the third resistance unit, the current generation circuit allows a current that depends on the current flowing through the third resistance unit to flow to the sensing resistance unit, and one of the sensing resistance unit and the mirror resistance unit is constituted as the second resistance unit.

* * * * *